United States Patent [19]

Choi

[11] Patent Number: 5,409,861
[45] Date of Patent: Apr. 25, 1995

[54] METHOD OF FORMING A VIA PLUG IN A SEMICONDUCTOR DEVICE

[75] Inventor: Kyeon K. Choi, Kyungki-Do, Rep. of Korea

[73] Assignee: Hyundai Electronics Industries Co., Ltd., Kyungki-do, Rep. of Korea

[21] Appl. No.: 305,306

[22] Filed: Sep. 15, 1994

[30] Foreign Application Priority Data

Sep. 15, 1993 [KR] Rep. of Korea ............... 93-18525

[51] Int. Cl.⁶ .................................................. H01L 21/44
[52] U.S. Cl. .................................... 437/195; 437/192; 437/203; 148/DIG. 138
[58] Field of Search ............... 437/190, 192, 195, 203; 148/DIG. 138

[56] References Cited

U.S. PATENT DOCUMENTS

| | | | |
|---|---|---|---|
| 5,198,389 | 2/1992 | DeBakker et al. | 437/190 |
| 5,232,872 | 8/1993 | Ohba | 437/192 |
| 5,270,256 | 12/1993 | Bost et al. | 437/203 |
| 5,320,979 | 6/1994 | Hashimoto et al. | 437/192 |

FOREIGN PATENT DOCUMENTS

| | | | |
|---|---|---|---|
| 0061323 | 3/1987 | Japan | 437/203 |
| 0156820 | 7/1987 | Japan | 437/203 |
| 4056237 | 2/1992 | Japan | 437/195 |
| 5259110 | 10/1993 | Japan | 437/190 |

*Primary Examiner*—Brian E. Hearn
*Assistant Examiner*—Tuan Nguyen
*Attorney, Agent, or Firm*—Fish & Richardson

[57] ABSTRACT

A method of forming a via plug in a semiconductor device is disclosed. Metal nuclei are formed on the surface of the metal layer underlying the via hole. The metal layer, which is partially exposed between metal nuclei, is etched by means of a wet etching method, and accordingly, a plurality of etching grooves is formed on the partially exposed surface of the metal layer. As a result, the formation of such grooves has the effect of increasing the bottom surface area of the via hall, thereby increasing the adhesive strength to a contact surface of the via hall and decreasing the via resistance.

14 Claims, 2 Drawing Sheets

METHOD OF FORMING A VIA PLUG IN A SEMICONDUCTOR DEVICE

FIELD OF THE INVENTION

The invention relates to a method of forming a via plug in a semiconductor device, more particularly, it relates to a method of forming a via plug by forming metal nuclei on the surface of a metal layer underlying a via hall and then etching the metal layer exposed between the metal nuclei by the wet etching method so that a plurality of etching grooves are formed thereupon. The formation of such grooves has the effect of increasing the bottom surface area of the via hall, thereby increasing the adhesive strength to a contact surface of the via hall and decreasing the via resistance.

INFORMATION DISCLOSURE STATEMENT

Generally, as integration of a semiconductor device is increased, the size of the via hall diminishes while the aspect ratio increases. If the depth of the via halls are different from each other, the via plug is formed on the via halls using tungsten. In order to form a uniform and complete via plug, pretreatment of the via halls is important. If the surface of the via halls is not uniform prior to and during application of the wet etching process, particles, such as a native oxide layer and polymer, are generated on the surface of the metal layer underlying the via halls. Accordingly, when the via plug is formed on the via halls, the tungsten is deposited with a luck of uniformity resulting in increased via resistance to; such increased resistance has a deleterious effect on subsequent processes culminating in the lowering of the electrical connecting characteristic of the semiconductor device.

Therefore, it is an object of the invention to provide a method of forming a via plug in a semiconductor device by which a fluorine particle and a native oxide layer formed on the surface of the metal layer underlying a via hole are removed and metal nuclei are formed on the surface of the metal layer. The metal layer between the metal nuclei is then exposed and etched by the wet etching method so as to increase the surface area of the adhesive contact area, thereby decreasing the via resistance while increasing the adhesive strength.

SUMMARY OF THE INVENTION

A method of forming a via plug according to the present invention in order to achieve the above object is comprised of the following steps:

A first metal layer is formed on a substrate and first, second and third insulating layers are sequentially deposited on the resulting substrate; the third insulating layer is then planarized;

A desired portion of the third, second and first insulating layer are etched using a contact mask until the first metal layer is exposed, thereby forming a via hole;

The via hole is pretreated by the dry etching method and then metal is selectively deposited on the surface of the first metal layer underlying the via hole using a metal depositing reactor, thereby forming metal nuclei;

The first metal layer exposed between the metal nuclei is etched so that a plurality of etching grooves is formed on the first metal layer.

BRIEF DESCRIPTION OF THE DRAWINGS

For fuller understanding of the nature and objects of the invention, reference should be made to the following detailed description taken in conjunction with the accompanying drawings in which.

Similar reference characters refer to similar parts throughout the several views of the drawings.

DETAILED DESCRIPTION OF THE INVENTION

FIGS. 1A through 1E are cross sectional views illustrating steps forming a via hole in a semiconductor device according to the present invention.

Figure 1A:
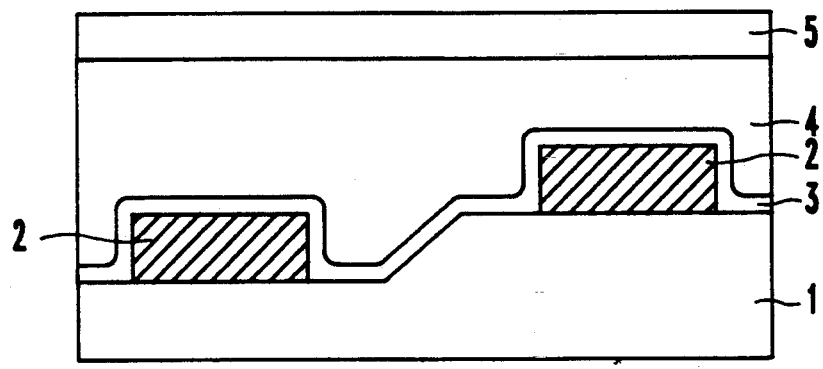
FIGS. 1A through 1E are cross sectional views illustrating steps forming a via hole in a semiconductor device according to the present invention.

Referring to FIG. 1A, a first metal layers 2 are initially formed on the substrate 1 in such a way so as to be isolated from each other. The first, second and third insulating layers 3, 4 and 5 are sequentially formed on the resulting substrate and then the third insulating layer 5 is planarized.

Figure 1B:
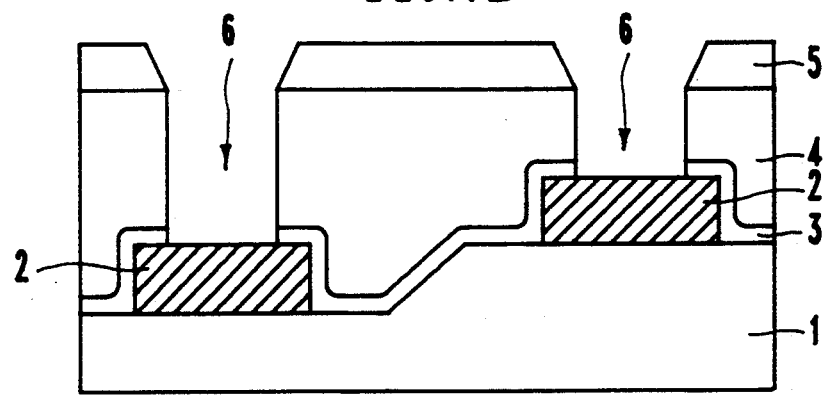

Referring to FIG. 1B, a desired portion of the first, second and third insulating layers 3, 4 and 5 situated on top of the first metal layers 2 are sequentially etched using the wet etching or dry etching method in order to connect to a second metal layer which will be formed in a later process, and thereby forming via holes 6 the aspect ratios of which are different from each other.

Figure 1C:
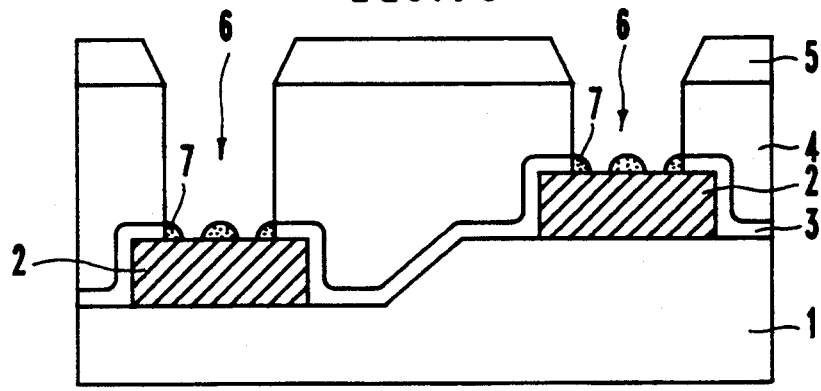

Referring to FIG. 1C, the via holes 6 are pretreated by the dry etching method in the RIE (Reactive Ion Etch) reactor during approximately one (1) minute using a $NF_3$, $SF_6$ or Ar sputter. Metal such as a tungsten(W), aluminum(Al), copper(Cu), molybdenum(Mo), titanium(Ti), cobalt(Co), or chromium(Cr) is then selectively deposited on the surface of the first metal layer 2 underlying the via holes 6 for a duration of approximately one (1) minute in the metal depositing reactor, thereby forming metal nuclei 7. The magnitude of the metal nuclei diameter is approximately 500 to 1000 Å. When the via holes 6 are pretreated, a fluorine particle compound and a native oxide layer is generated.

Figure 1D:
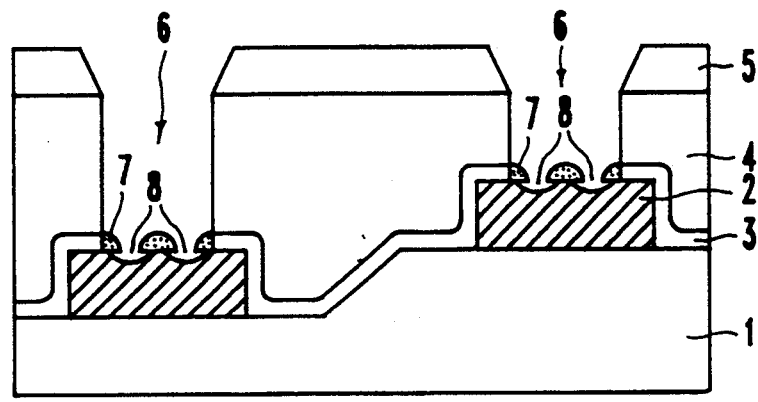

Referring to FIG. 1D, the first metal layer partially exposed between the metal nuclei 7 is etched by the wet etchant such as BOE (Buffered Oxide Etchant) in such a way that the metal nuclei 7 remains, and thereby forming a plurality of etching grooves 8 on the surface of the first metal layer 2. The wet etchant's etching selectivity is greater for the first metal layer 2 than it is for the metal nuclei 7.

As the wet etching method forms etching grooves 8 on the surface of the partially exposed metal layer, the contact area is increased and a fluorine particle compound, and native oxide layer are removed. As a result, when the via plug is formed on the via hole, the adhesive strength is increased while the via resistance is decreased.

Figure 1E:
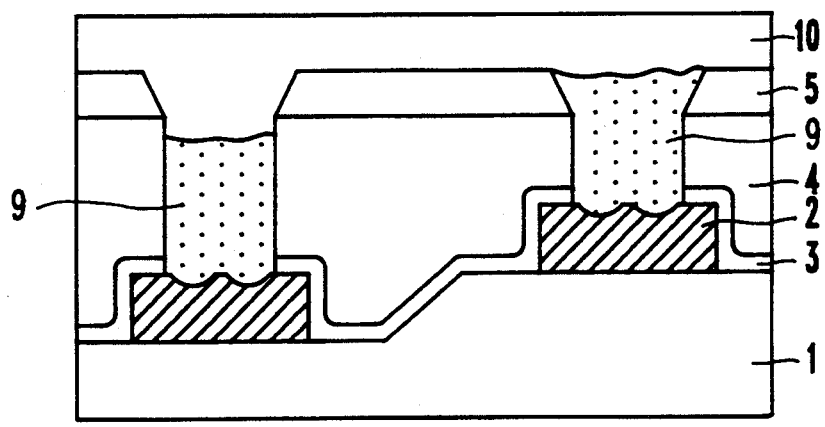

Referring to FIG. 1E, a via plug 9 is formed on the via holes 6 using a LPCVD reactor, and then a second metal layer 10 is formed to connect with the via plug 9.

As described above, according to the present invention, metal nuclei are formed on the via hole and then etching grooves are formed on the partially exposed metal layer under the via hole to increase the area of contact for connection with the via plug. Accordingly, the removal of particles which contribute to the increased via resistance results in a decrease of via resistance and improves the adhesive strength thereof. As a result, the electrical connection characteristic of the semiconductor device is improved.

Although this invention has been described in its preferred embodiment with a certain degree of particularity, one skilled in the art would know that the preferred embodiment disclosed here is only an example and that the construction, combination and arrangement of its parts may be varied without departing from the spirit and the scope of the invention.

What is claimed is:

1. A method of forming a via plug in a semiconductor device comprises;
    forming a first metal layer on a substrate and sequentially depositing a first, second and third insulating layer on the resulting substrate and then planarizing said third insulating layer;
    etching a desired portion of said third, second and first insulating layer using a contact mask until said first metal layer is exposed, thereby forming a via hole;
    pretreating said via hole by the dry etching method and then, forming metal nuclei on the surface of said first metal layer at the bottom of said via hole;
    etching said first metal layer exposed between said metal nuclei so that a plurality of etching grooves is formed on said first metal layer; and
    forming a via plug on said via hole.

2. The method of claim 1, wherein said first metal layer exposed between said metal nuclei is etched by the wet etchant which the etching selectivity of said first metal layer is greater than said that of said metal nuclei.

3. The method of claim 1, wherein said via plug is formed in the LPCVD reactor.

4. The method of claim 1, wherein the magnitude of each nuclei is 500 to 1000 Å.

5. The method of claim 1, wherein said via hole is pretreated in the RIE reactor.

6. The method of claim 1, wherein said via hole is pretreated by a $NF_3$, $SF_6$ or Ar sputter.

7. The method of claim 1, wherein said etching grooves are formed using the buffered oxide etchant.

8. The method of claim 1, wherein said metal nuclei are formed by tungsten.

9. The method of claim 1, wherein said metal nuclei are formed by aluminum.

10. The method of claim 1, wherein said metal nuclei are formed by copper.

11. The method of claim 1, wherein said metal nuclei are formed by molybdenum.

12. The method of claim 1, wherein said metal nuclei are formed by titanium.

13. The method of claim 1, wherein said metal nuclei are formed by cobalt.

14. The method of claim 1, wherein said metal nuclei are formed by chromium.

* * * * *